(12) United States Patent
Liu et al.

(10) Patent No.: US 10,892,161 B2
(45) Date of Patent: Jan. 12, 2021

(54) ENHANCED SELECTIVE DEPOSITION PROCESS

(71) Applicant: Applied Materials, Inc., Santa Clara, CA (US)

(72) Inventors: Biao Liu, San Jose, CA (US); Cheng Pan, San Jose, CA (US); Erica Chen, Cupertino, CA (US); Srinivas D. Nemani, Sunnyvale, CA (US); Chang Ke, Sunnyvale, CA (US); Lei Zhou, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 153 days.

(21) Appl. No.: 16/169,610

(22) Filed: Oct. 24, 2018

(65) Prior Publication Data

US 2019/0148144 A1    May 16, 2019

Related U.S. Application Data

(60) Provisional application No. 62/586,060, filed on Nov. 14, 2017.

(51) Int. Cl.
| | |
|---|---|
| *H01L 21/02* | (2006.01) |
| *H01L 23/31* | (2006.01) |
| *H01L 21/768* | (2006.01) |
| *H01L 23/29* | (2006.01) |
| *H01L 21/3105* | (2006.01) |
| *H01L 21/321* | (2006.01) |

(Continued)

(52) U.S. Cl.
CPC ........ *H01L 21/02645* (2013.01); *C23C 16/00* (2013.01); *H01L 21/0228* (2013.01); *H01L 21/02304* (2013.01); *H01L 21/02312* (2013.01); *H01L 21/3105* (2013.01); *H01L 21/321* (2013.01); *H01L 21/768* (2013.01); *H01L 23/293* (2013.01); *H01L 23/3171* (2013.01); *B05D 1/185* (2013.01); *H01L 21/32* (2013.01)

(58) Field of Classification Search
None
See application file for complete search history.

(56) References Cited

U.S. PATENT DOCUMENTS

| | | | |
|---|---|---|---|
| 2002/0182385 A1 | 12/2002 | Senkevich et al. | |
| 2009/0280157 A1 | 11/2009 | Maas et al. | |
| (Continued) | | | |

FOREIGN PATENT DOCUMENTS

JP     2011190499 A     9/2011

OTHER PUBLICATIONS

International Search Report and Written Opinion for PCT/US2018/058334 dated Feb. 22, 2019.

*Primary Examiner* — Shamim Ahmed
*Assistant Examiner* — Bradford M Gates
(74) *Attorney, Agent, or Firm* — Patterson + Sheridan, LLP (57) ABSTRACT

Methods for depositing desired materials formed on certain locations of a substrate with desired materials using a selective deposition process for semiconductor applications are provided. In one embodiment, a method of forming a structure with desired materials on a substrate includes supplying a first gas comprising a hydroxy terminated hydrocarbon containing material to a surface of a substrate, selectively forming a passivation layer on a first material of the substrate, selectively forming self assembled monolayers on a second material of the substrate, and selectively forming a material layer on the passivation layer.

20 Claims, 4 Drawing Sheets

(51) Int. Cl.
*C23C 16/00* (2006.01)
*B05D 1/18* (2006.01)
*H01L 21/32* (2006.01)

(56) References Cited

U.S. PATENT DOCUMENTS

| | | |
|---|---|---|
| 2015/0294863 A1 | 10/2015 | Nemani et al. |
| 2016/0244581 A1 | 8/2016 | Brink et al. |
| 2017/0062210 A1 | 3/2017 | Visser et al. |
| 2017/0069527 A1 | 3/2017 | Haukka et al. |
| 2017/0194196 A1 | 7/2017 | Brink et al. |

ENHANCED SELECTIVE DEPOSITION PROCESS

CROSS-REFERENCE TO RELATED APPLICATIONS

This application claims benefit of U.S. Patent Application No. 62/586,060, filed on Nov. 14, 2017, the contents of which are herein incorporated by reference.

BACKGROUND

Field

Embodiments generally relate to methods for selectively forming desired materials on certain locations of a semiconductor substrate. More specifically, embodiments relate to methods for selectively forming desired materials on a substrate with different materials at different locations of the substrate by a selective deposition process utilizing localized passivation deposition.

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success and to the continued effort to increase circuit density and quality of individual substrates and die.

As the geometry limits of the structures used to form semiconductor devices are pushed against technology limits, the need for accurate formation with desired materials for the manufacture of structures having small critical dimensions and high aspect ratios and structures with different materials has become increasingly difficult to satisfy. A conventional method for selective deposition may be performed to locally form a material layer on only certain locations of a planer surface on a substrate made from a material different than the substrate material. However, as the geometry limits of the structures continue to push, the selective deposition process may not be efficiently confined and formed at the designated small dimensions on the substrate, resulting in undesired materials formed on the undesired locations of the substrate. Thus, the materials would be globally formed on the entire surface of such substrate without selectivity, thus making the selective material deposition difficult to achieve.

Thus, there is a need for improved methods for a selective deposition process suitable for advanced generation of semiconductor chips or other semiconductor devices.

SUMMARY

Methods for depositing desired materials formed on certain locations of a substrate with desired materials using a selective deposition process for semiconductor applications are provided. In one embodiment, a method of forming a structure with desired materials on a substrate includes supplying a first gas comprising a hydroxy terminated hydrocarbon containing material to a surface of a substrate, selectively forming a passivation layer on a first material of the substrate, selectively forming self assembled monolayers on a second material of the substrate, and selectively forming a material layer on the passivation layer.

In another embodiment, a method of forming a structure with desired materials on a substrate for semiconductor applications includes selectively forming a passivation layer on a first material of a substrate, wherein the passivation layer comprising a metal material having hydro-group (—H) or —OCH$_3$ group attached thereto, selectively forming self assembled monolayers on a second material of the substrate, and selectively forming a material layer on the passivation layer using an atomic layer deposition process.

In yet another embodiment, a structure includes a passivation layer comprising a metal material having hydro-group (—H) or —OCH$_3$ group attached thereto formed on a first material of a substrate, wherein the substrate includes a second material formed among the first material, wherein the first material is a metal material and the second material is an insulating material, and a material layer formed on the passivation layer, wherein the material layer is a metal containing dielectric layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

Methods for selectively depositing certain materials at certain locations on a structure formed on the substrate are provided. The structure may include a back-end structure, front-end structure, interconnection structure, passivation structure, fin structure, a gate structure, a contact structure, or any suitable structure in semiconductor devices. In one example, a selective deposition process may be utilized to form different materials on different surfaces, e.g., different portions of a structure formed on a substrate by utilizing a passivation layer formed selectively on certain locations of the substrate. In one example, a passivation layer is formed on a first material of the substrate. Subsequently, a self-assembled monolayer (SAM) deposition process may be performed to form a self-assembled monolayer on a second material of the substrate. As the first material of the substrate is passivated by the passivation there, thus assisting the self-assembled monolayer to be formed selectively on the second material of the substrate without out-reaching to the first material of the substrate. Subsequently, an atomic layer deposition (ALD) may be performed to form a metal containing layer selectively on the passivation layer. After the metal containing layer is formed, the self-assembled monolayer may then be removed from the substrate, forming the metal-containing layer selectively formed on the first material of the substrate without on the second material of the substrate.

Figure 1:
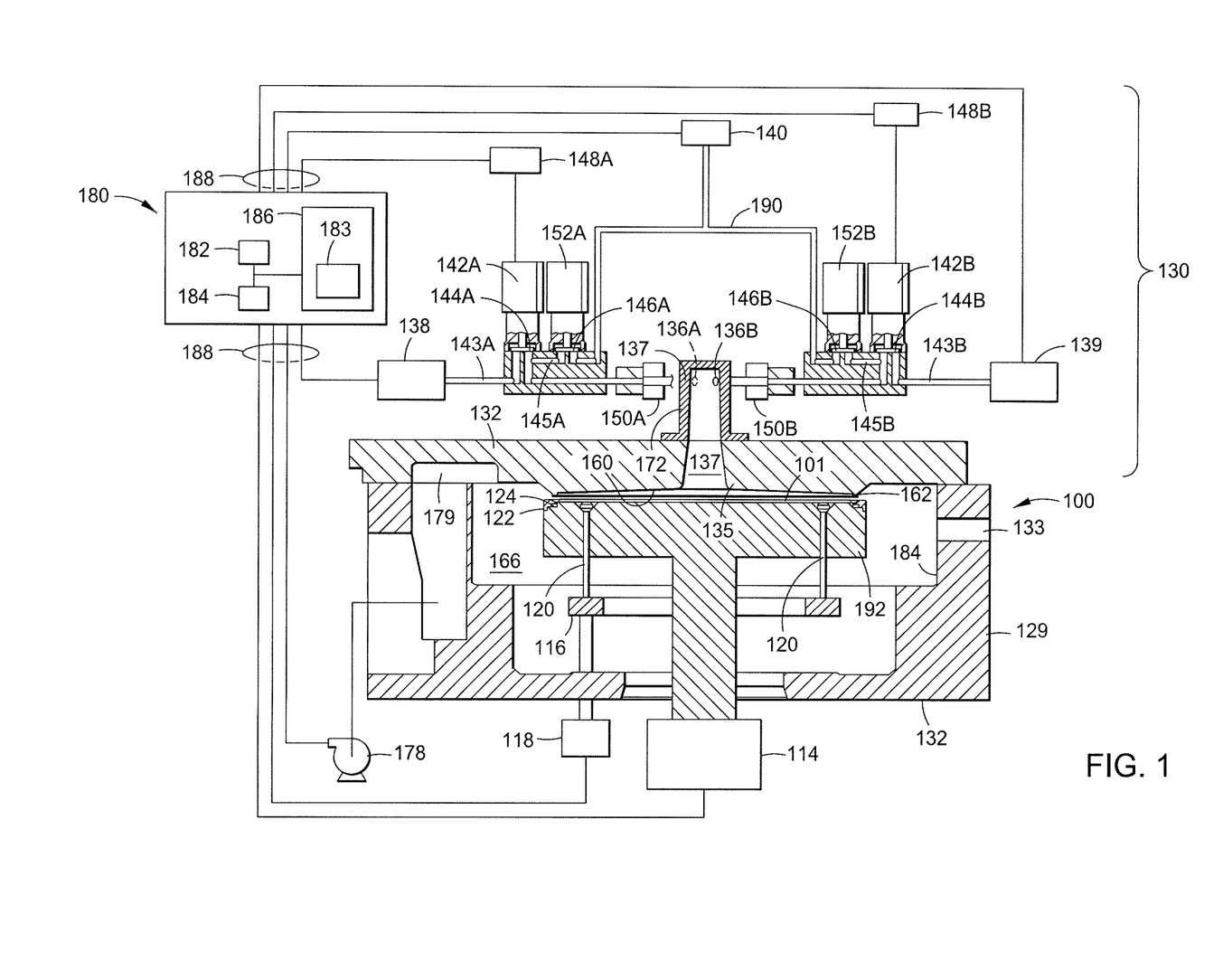
FIG. 1 depict an apparatus that may be utilized to perform an atomic layer deposition (ALD) process.

FIG. 1 is a schematic cross-sectional view of one embodiment of an atomic layer deposition (ALD) processing chamber 100. The ALD processing chamber 100 includes a gas delivery apparatus 130 adapted for cyclic deposition, such as ALD or chemical vapor deposition (CVD). The terms ALD and CVD as used herein refer to the sequential introduction of reactants to deposit a thin layer over a substrate structure. The sequential introduction of reactants may be repeated to deposit a plurality of thin layers to form a conformal layer to a desired thickness. The chamber 100 may also be adapted for other deposition techniques along with lithography process.

The chamber 100 comprises a chamber body 129 having a bottom 132. A slit valve tunnel 133 formed through the chamber body 129 provides access for a robot (not shown) to deliver and retrieve a substrate 101, such as a 200 mm, 300 mm or 450 mm semiconductor substrate or a glass substrate, from the chamber 100.

A substrate support 192 is disposed in the chamber 100 and supports the substrate 101 during processing. The substrate support 192 is mounted to a lift 114 to raise and lower the substrate support 192 and the substrate 101 disposed thereon. A lift plate 116 is connected to a lift plate actuator 118 that controls the elevation of the lift plate 116. The lift plate 116 may be raised and lowered to raise and lower pins 120 movably disposed through the substrate support 192. The pins 120 are utilized to raise and lower the substrate 101 over the surface of the substrate support 192. The substrate support 192 may include a vacuum chuck, an electrostatic chuck, or a clamp ring for securing the substrate 101 to the surface of the substrate support 192 during processing.

The substrate support 192 may be heated to heat the substrate 101 disposed thereon. For example, the substrate support 192 may be heated using an embedded heating element, such as a resistive heater, or may be heated using radiant heat, such as heating lamps disposed above the substrate support 192. A purge ring 122 may be disposed on the substrate support 192 to define a purge channel 124 which provides a purge gas to a peripheral portion of the substrate 101 to prevent deposition thereon.

A gas delivery apparatus 130 is disposed at an upper portion of the chamber body 129 to provide a gas, such as a process gas and/or a purge gas, to the chamber 100. A pumping system 178 is in communication with a pumping channel 179 to evacuate any desired gases from the chamber 100 and to help maintain a desired pressure or a desired pressure range inside a pumping zone 166 of the chamber 100.

In one embodiment, the gas delivery apparatus 130 comprises a chamber lid 132. The chamber lid 132 includes an expanding channel 137 extending from a central portion of the chamber lid 132 and a bottom surface 160 extending from the expanding channel 137 to a peripheral portion of the chamber lid 132. The bottom surface 160 is sized and shaped to substantially cover the substrate 101 disposed on the substrate support 192. The chamber lid 132 may have a choke 162 at a peripheral portion of the chamber lid 132 adjacent the periphery of the substrate 101. The cap portion 172 includes a portion of the expanding channel 137 and gas inlets 136A, 136B. The expanding channel 137 has gas inlets 136A, 136B to provide gas flows from two similar valves 142A, 142B. The gas flows from the valves 142A, 142B may be provided together and/or separately.

In one configuration, valve 142A and valve 142B are coupled to separate reactant gas sources, but are coupled to the same purge gas source. For example, valve 142A is coupled to a reactant gas source 138 and valve 142B is coupled to reactant gas source 139, which both valves 142A, 142B are coupled to purge a gas source 140. Each valve 142A, 142B includes a delivery line 143A, 143B having a valve seat assembly 144A, 144B and includes a purge line 145A, 145B having a valve seat assembly 146A, 146B. The delivery line 143A, 143B is in communication with the reactant gas source 138, 139 and is in communication with the gas inlet 137A, 137B of the expanding channel 190. The valve seat assembly 144A, 144B of the delivery line 143A, 143B controls the flow of the reactant gas from the reactant gas source 138, 139 to the expanding channel 190. The purge line 145A, 145B is in communication with the purge gas source 140 and intersects the delivery line 143A, 143B downstream of the valve seat assembly 144A, 144B of the delivery line 143A, 143B. The valve seat assembly 146A, 146B of the purge line 145A, 145B controls the flow of the purge gas from the purge gas source 140 to the delivery line 143A, 143B. If a carrier gas is used to deliver reactant gases from the reactant gas source 138, 139, the same gas may be used as a carrier gas and a purge gas (i.e., an argon gas may be used as both a carrier gas and a purge gas).

Each valve 142A, 142B may be a zero dead volume valve to enable flushing of a reactant gas from the delivery line 143A, 143B when the valve seat assembly 144A, 144B of the valve is closed. For example, the purge line 145A, 145B may be positioned adjacent the valve seat assembly 144A, 144B of the delivery line 143A, 143B. When the valve seat assembly 144A, 144B is closed, the purge line 145A, 145B may provide a purge gas to flush the delivery line 143A, 143B. In the embodiment shown, the purge line 145A, 145B is positioned as slightly spaced from the valve seat assembly 144A, 144B of the delivery line 143A, 143B so that a purge gas is not directly delivered into the valve seat assembly 144A, 144B when open. A zero dead volume valve as used herein is defined as a valve which has negligible dead volume (i.e., not necessary zero dead volume.) Each valve 142A, 142B may be adapted to provide a combined gas flow and/or separate gas flow of the reactant gas from the sources 138, 139 and the purge gas from the source 140. The pulses of the purge gas may be provided by opening and closing a diaphragm of the valve seat assembly 146A of the purge line 145A. The pulses of the reactant gas from the reactant gas source 138 may be provided by opening and closing the valve seat assembly 144A of the delivery line 143A.

A control unit 180 may be coupled to the chamber 100 to control processing conditions. The control unit 180 comprises a central processing unit (CPU) 182, support circuitry 184, and memory 186 containing associated control software 183. The control unit 180 may be one of any form of general purpose computer processors that can be used in an industrial setting for controlling various chambers and subprocessors. The CPU 182 may use any suitable memory 186, such as random access memory, read only memory, floppy disk drive, compact disc drive, hard disk, or any other form of digital storage, local or remote. Various support circuits may be coupled to the CPU 182 for supporting the chamber 100. The control unit 180 may be coupled to another controller that is located adjacent individual chamber components, such as the programmable logic controllers 148A, 148B of the valves 142A, 142B. Bi-directional communications between the control unit 180 and various other components of the chamber 100 are handled through numerous signal cables collectively referred to as signal buses 188, some of which are illustrated in FIG. 1. In addition to the control of process gases and purge gases from gas sources 138, 139, 140 and from the programmable logic controllers 148A, 148B of the valves 142A, 142B, the control unit 180 may be configured to be responsible for automated control of other activities used in substrate processing, such as substrate transport, temperature control, chamber evacuation, among other activities, some of which are described elsewhere herein.

Figure 2:
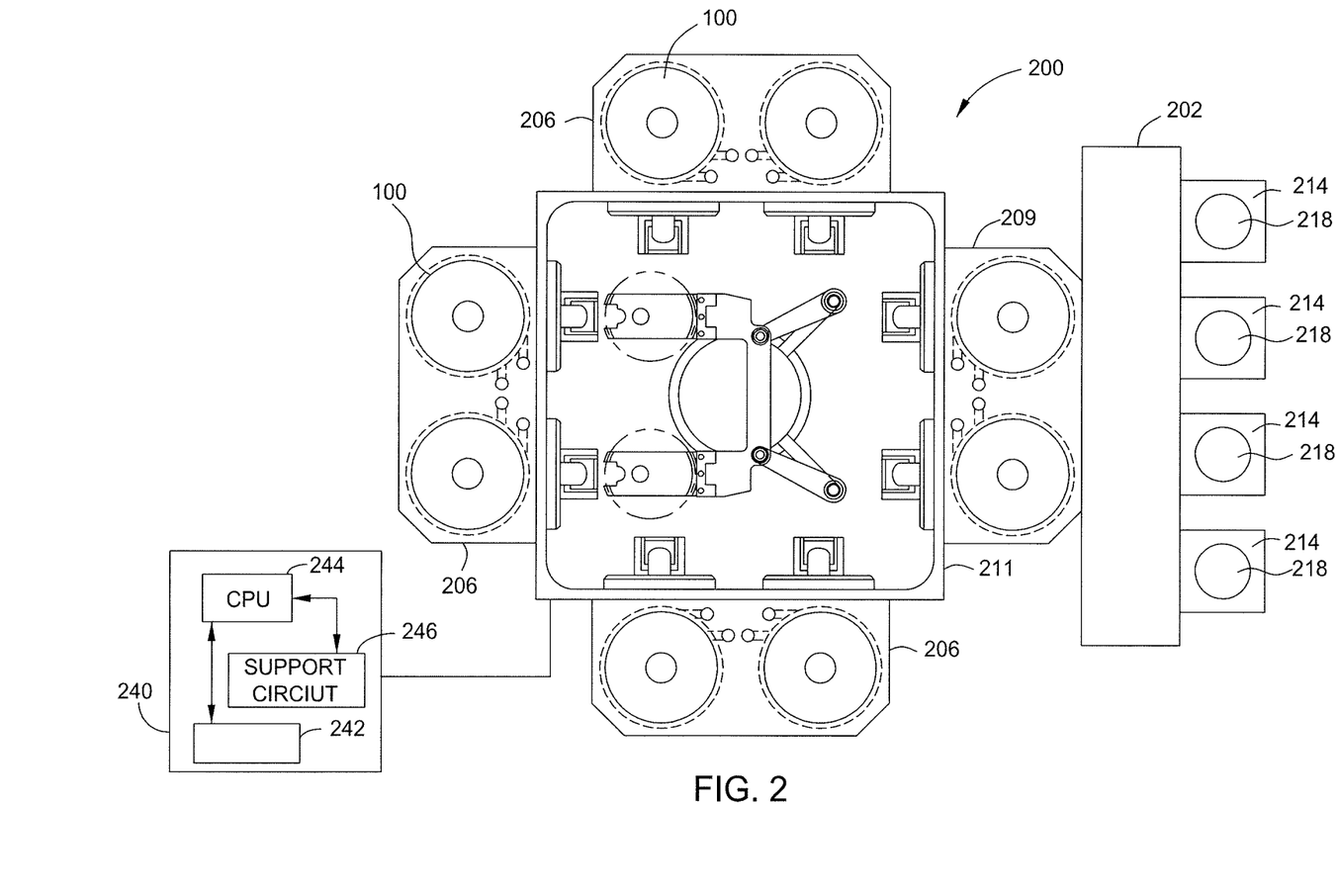
FIG. 2 depicts a schematic view of a cluster processing system that includes the apparatus of FIG. 1.

FIG. 2 depicts a plan view of a semiconductor processing system 200 that the methods described herein may be practiced. One processing system that may be adapted to benefit from the disclosure is a 300 mm or 450 mm PRODUCER® processing system, commercially available from Applied Materials, Inc., of Santa Clara, Calif. The processing system 200 generally includes a front platform 202 where substrate cassettes 218 included in FOUPs 214 are supported and substrates are loaded into and unloaded from a loadlock chamber 209, a transfer chamber 211 housing a substrate handler 213 and a series of tandem processing chambers 206 mounted on the transfer chamber 211.

Each of the tandem processing chambers 206 includes two process regions for processing the substrates. The two process regions share a common supply of gases, common pressure control, and common process gas exhaust/pumping system. Modular design of the system enables rapid conversion from one configuration to any other. The arrangement and combination of chambers may be altered for purposes of performing specific process steps. Any of the tandem processing chambers 206 can include a lid according to aspects of the disclosure as described below that includes one or more chamber configurations described above with referenced to the processing chamber 100 depicted in FIG. 1. It is noted that the processing system 200 may be configured to perform a deposition process, etching process, curing processes, or heating/annealing process as needed. In one embodiment, the processing chamber 100, shown as a single chamber designed in FIG. 1, may be incorporated into the semiconductor processing system 200.

In one implementation, the processing system 200 can be adapted with one or more of the tandem processing chambers having supporting chamber hardware known to accommodate various other known processes such as chemical vapor deposition (CVD), physical vapor deposition (PVD), atomic layer deposition (ALD), spin coating, etching, curing, or heating/annealing and the like. For example, the system 200 can be configured with one of the processing chambers 100 depicted in FIG. 1 as an atomic layer deposition processing chamber for forming a passivation layer or a metal containing dielectric layers, metal layers or insulating materials formed on the substrates. Such a configuration can enhance research and development fabrication utilization and, if desired, substantially eliminate exposure of films as etched to atmosphere.

A controller 240, including a central processing unit (CPU) 244, a memory 242, and support circuits 246, is coupled to the various components of the semiconductor processing system 200 to facilitate control of the processes of the present disclosure. The memory 242 can be any computer-readable medium, such as random access memory (RAM), read only memory (ROM), floppy disk, hard disk, or any other form of digital storage, local or remote to the semiconductor processing system 200 or CPU 244. The support circuits 246 are coupled to the CPU 244 for supporting the CPU in a conventional manner. These circuits include cache, power supplies, clock circuits, input/output circuitry and subsystems, and the like. A software routine or a series of program instructions stored in the memory 242, when executed by the CPU 344, executes the tandem processing chambers 206.

Figure 3:
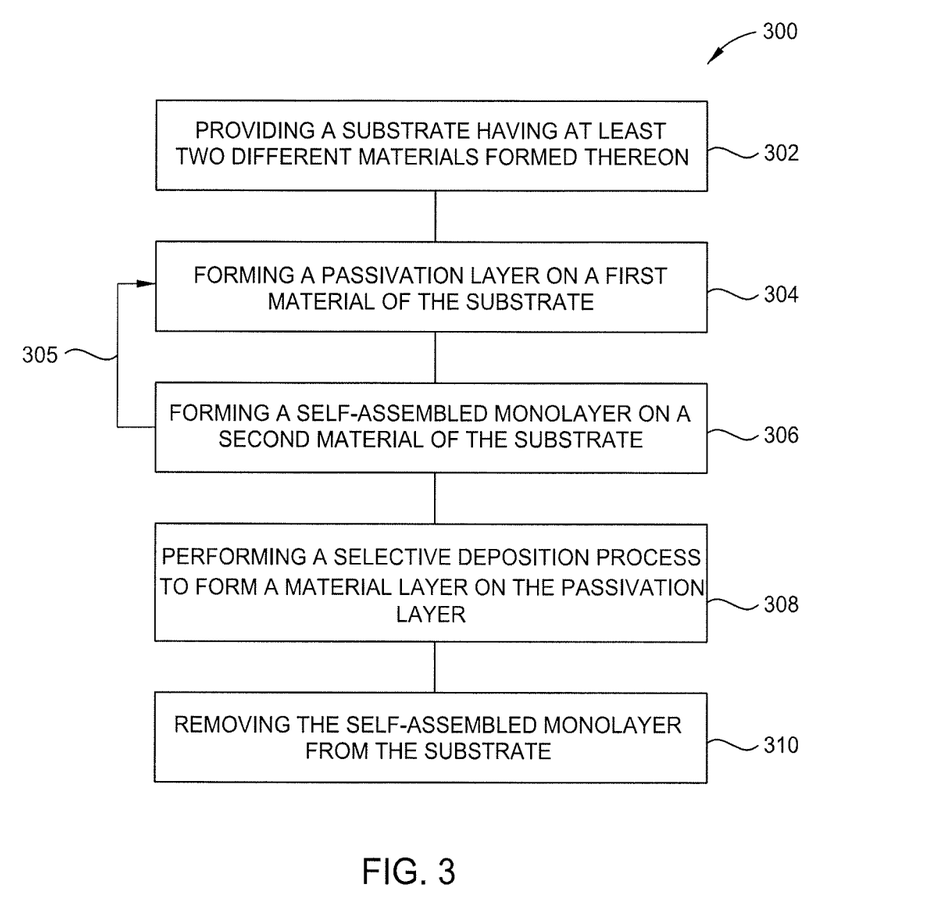
FIG. 3 depicts a flow diagram of an example of a method for selectively forming a material on certain locations on a substrate.

FIG. 3 is a flow diagram of one example of a selective deposition process 300 that may be performed to form certain materials on certain locations of a structure formed on a substrate. The structure may be any suitable structures formed on a semiconductor substrate, such as interconnection structure with conductive and non-conductive areas, a fin structure, a gate structure, a contact structure, a front-end structure, a back-end structure or any other suitable structures utilized in semiconductor applications. FIGS. 4A-4E are schematic cross-sectional views of a portion of a substrate 101 corresponding to various stages of the process 300. The process 300 may be utilized to a back-end interconnection structure both conductive and non-conductive areas formed on a substrate so as to form desired materials formed on different locations of the back-end interconnection structure. Alternatively, the process 300 may be beneficially utilized to selectively form different materials on different locations of a substrate having more than one material.

Figure 4A:
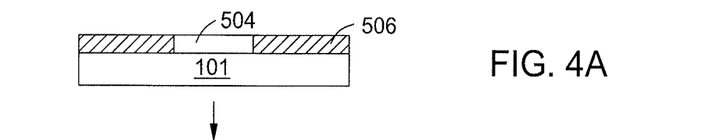
FIGS. 4A-4E depict one embodiment of a sequence for forming a material selectively on certain locations on the substrate during the manufacturing process according to the process depicted in FIG. 4.

The process 300 begins at operation 302 by providing a substrate, such as the substrate 101 depicted in FIG. 1, as shown in FIG. 4A. In one embodiment, the substrate 101 may have an interconnection structure 502 formed on the substrate 101. In one example, the interconnection structure 502 may be utilized in a back-end structure for forming semiconductor devices. In the example depicted in FIG. 4A, the interconnection structure 502 may include a metal material 504 formed in an insulating material 506. It is noted that the interconnection structure 502 may be any structures, including front-end structures or gate structures utilized for forming semiconductor devices.

In one example, the substrate 101 may include materials selected from a group consisting of crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 101 may have various dimensions, such as 200 mm, 300 mm, 450 mm or other diameter, as well as, being a rectangular or square panel. Unless otherwise noted, embodiments and examples described herein are conducted on substrates with a 200 mm diameter, a 300 mm diameter, or a 450 mm diameter substrate. In the embodiment wherein a SOI structure is utilized for the substrate 101, the substrate 101 may include a buried dielectric layer disposed on a silicon crystalline substrate. In the embodiment depicted herein, the substrate 101 may be a crystalline silicon substrate. Moreover, the substrate 101 is not limited to any particular size or shape. The substrate 101 may be a round substrate having a 200 mm diameter, a 300 mm diameter or other diameters, such as 450 mm, among others. The substrate 101 may also be any polygonal, square, rectangular, curved or otherwise non-circular workpiece, such as a polygonal glass substrate used in the fabrication of flat panel displays.

Although the example depicted in FIG. 5A shown that the interconnection structure 502 is formed on the substrate 101, it is noted that there may be further structures formed between the interconnection structure 502 and the substrate 101 as needed. In one example, a front-end structure, such as a gate structure and/or a contact structure may be formed between the interconnection structure 502 and the substrate 101 to enable functions of the semiconductor devices.

In one example, the insulating material 506 included in the interconnection structure 502 may be a dielectric material, such as silicon oxide material, silicon containing materials, doped silicon materials, low-k material, such as carbon containing materials. Suitable carbon containing materials include amorphous carbon, SiC, SiOC, doped carbon materials or any suitable materials. Suitable examples of the low-k insulating dielectric material includes SiO containing materials, SiN containing materials, SiOC containing materials, SiC containing materials, carbon based materials, or other suitable materials.

The insulating material may be formed by a plasma enhanced chemical vapor deposition (CVD), a flowable chemical vapor deposition (CVD), a high density plasma (HDP) chemical vapor deposition (CVD) process, atomic layer deposition (ALD), cyclical layer deposition (CLD), physical vapor deposition (PVD), or the like as needed.

The metal material 504 formed in the insulating material 506 is exposed ready to receive another materials formed thereon. Similarly, the insulating material 506 is also exposed to receive a second type of material for process integration when needed. Suitable examples of the materials for the metal material 504 include tungsten (W), tantalum (Ta), titanium (Ti), copper (Cu), ruthenium (Ru), nickel (Ni), cobalt (Co), chromium (Cr), iron (Fe), manganese (Mn), aluminum (Al), hafnium (Hf), vanadium (V), molybdenum (Mo), palladium (Pd), gold (Au), silver (Au), platinum (Pt), alloys thereof, and combinations thereof, among others. In one particular example, the metal material 504 is a ruthenium (Ru), cobalt (Co), or a tungsten (W) layer.

Figure 4B:
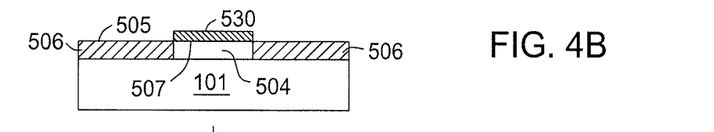

At operation 304, a passivation layer deposition process is performed to form a passivation layer 530 selectively on the metal material 504, as shown in FIG. 4B. The passivation layer 530 may be formed by a deposition chamber, such as the atomic layer deposition (ALD) chamber, depicted in FIG. 1. The passivation layer 530 formed on the metal material 504 provides surface properties different from other surfaces (e.g., the insulating material 506 or a self-assembled layer subsequently formed thereon), thus assisting the self-assembled monolayer to be selectively formed on a different material (e.g., the insulating material 506 on the substrate 101) without out-reaching to the metal material 504.

The passivation layer 530 may be formed by supplying a processing gas to the substrate 101. The processing gas includes an organic gas comprising hydrocarbon compounds with OH (hydroxy) terminated functional group. The organic gas suitable for forming the passivation layer 530 includes an OH (hydroxy) terminated hydrocarbon containing material with or without benzene rings. Suitable examples of the OH terminated hydrocarbon containing material include methanol, ethanol, propanol, and the like. In one example, the OH terminated hydrocarbon has a formula of $(C_xH_y)(OH)_z$, which x, y and z are integers. In one specific example, the OH terminated hydrocarbon containing material is methanol ($CH_3OH$) or ethanol ($C_2H_5OH$).

It is noted that the organic gas as used here can not only assist forming the passivation layer 530, but also help to remove the surface contaminate prior to forming the passivation layer 530. The organic gas may remove the surface contaminant, such as the carbon leftover from the ambient environment, so that the bonding of the passivation layer 530 to the substrate is enhanced.

In some example, native oxides are often found on a surface 507 of the metal material 504, forming metal oxide (e.g., Metal-O). When the processing gas, e.g., an organic gas in this example, is supplied onto the substrate surface, the hydrogen elements (—H) from the OH (hydroxy) group of the organic gas reduces the surface native metal oxide from the metal material 504, forming a hydro-group (—H) or —OCH$_3$ group attached to the metal surface (Metal-H). Suitable reaction equations may be found below.

Metal-O+CxHyOH→Metal-H+byproduct; or

Metal-O+CxHyOH→Metal-OCH$_3$+byproduct

Thus, the native oxides from the surface 507 of the metal material 504 is reduced by the organic gas from the processing gas, forming Metal-H, or Metal-OCH$_3$ terminals as a passivation layer 530 passivating the metal material 504. The passivation layer 530 as formed is some molecules absorbed on the surface 507 (e.g., interface) of the metal material 504 with minimum alternation of the properties of the metal material 504 at the interface.

In one embodiment, during the passivation layer deposition process, the substrate temperature may be controlled from room temperature to about 300 degrees Celsius. In one example, the passivation layer 530 may have a thickness between about 2 Å and about 30 Å, such as about 3 Å and about 20 Å.

During deposition of the passivation layer 530, the substrate temperature may be maintained at between about 100 degrees Celsius and about 300 degrees Celsius. The process pressure may be controlled at between about 100 Torr and about 300 Torr. RF source and bias powers may or may not be used during the deposition of the passivation layer 530. In one specific example, the passivation layer 530 is formed without applying a RF source or bias power.

Figure 4C:
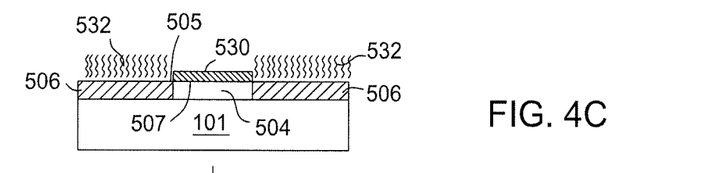

At operation 306, a self-assembled monolayer deposition process is performed to selectively form self-assembled monolayers 532 on a surface 505 of the insulating material 506, as shown in FIG. 4C. Self assembled monolayers (SAM) are ordered molecular assemblies formed by adsorption of molecules on the substrate surface. Self assembled monolayers (SAM) are thin organic (or inorganic in rare cases) films which form spontaneously on solid surfaces. By proper selection of the precursors, the self-assembled monolayers 532 with desired film properties may be adsorbed and formed on predominantly certain locations, e.g., the surface 505 of the insulating material 506 of the substrate 101, that predominately absorb the self-assembled monolayers 532, rather than globally formed across the substrate 101. Furthermore, as the passivation layer 530 is formed on the substrate 101 passivating the metal material 504, the self-assembled monolayers 532 are confined in the surface 505 of the insulating material 506 of the substrate 101, without out-reaching to the metal material 504, thus, providing a selective deposition process.

In one embodiment, the self-assembled monolayers 532 may be used for modification of surface properties, including wetting, adhesion, friction, chemical sensing, ultrafine scale lithography, and protection. By modification of the surface properties, a surface chemical reaction may occur, enhancing absorption of molecules provided during the formation of the self-assembled monolayers 532. The self-assembled monolayers 532 has a first part, called "head group", which absorb on the substrate surface and a second part, called "terminal group", which are exposed to later react and adhere with the subsequent molecules supplied from new precursors present later in the deposition process. The head group and the terminal group may be connected by alkyl chain. In the embodiment depicted herein, the head group performs a chemical interaction with the surface 505 of the insulating material 506, absorbing at surface sites, resulting in a close-packed monolayer. The terminal group from the self-assembled monolayers 532 may modify surface properties, ranging from reactive, high energies to passive, low energies, for chemical sensing, passivation, hydrophobicity, adhesion promotion, and corrosion protection so as to enhance or eliminate the attachment of the molecules from the precursors from the subsequent processes.

In one embodiment, the self-assembled monolayer (SAM) deposition process may be performed by dipping, immersing, spraying, soaking, flooding, or rinsing the substrate with a solution based (e.g., liquid based) precursor. In some embodiments, a vapor process may be utilized to expose the substrate to a precursor in gas phase. In the embodiment depicted herein, a vapor process may be performed as the vapor process may eliminate the likelihood of aggregation occurring at different locations of the structures, which may be a problem in a liquid-phase process. The vapor deposition may be performed in a vacuum system, which may be integrated with the ALD processing chamber 100 utilized to perform the passivation layer deposition process, as described above at operation 304, prior to the self-assembled monolayer (SAM) deposition process at operation 306 is performed.

In one embodiment, suitable examples of the self-assembled monolayer precursors utilized to perform the self-assembled monolayer (SAM) deposition process includes precursors having head groups as alkanethiols, [X—(CH$_2$)$_n$—SH], which X are any suitable compounds, which are formed on metal surface, such as Ag, Au, Cu or Al, or alkyltrichlorosilanes [X—(CH$_2$-n-SiCl$_3$) formed on dielectric surfaces, such as SiO$_2$, Al$_2$O$_3$, TiO, TaO, Si, or other oxides. The precursors used during the self-assembled monolayer (SAM) deposition process may modify hydrophobicity of the surface where they are attached onto.

In the example depicted in FIG. 5C, the self-assembled monolayers 532 is selected to have head groups configured to attach to dielectric surfaces, such as SiO$_2$, Al$_2$O$_3$, TiO, TaO, Si, or other oxides, such as on the surface 505 of the insulating material 506.

It is noted that the passivation layer deposition process at operation 304 and the self-assembled monolayer (SAM) deposition process at operation 306 may be a one-step process to form the passivation layer 530 and the self-assembled monolayers 532 until the desired thicknesses of each layer is formed. In some embodiments, the passivation layer 530 and the self-assembled monolayers 532, as indicated by the loop 305 in FIG. 3, may be alternatively formed to form a first monolayer of passivation layer 530 then followed by another monolayer of the self-assembled monolayers 532 (e.g., switching different pulses of processing gas from operation 304 and the self-assembled monolayer precursor at operation 306). Thus, monolayers of the passivation layer 530 and the self-assembled monolayers 532 may be alternatively formed. In some examples, between the pulses of the processing gas from operation 304 and the self-assembled monolayer precursor from operation 306, a purge (e.g., also a pulse) of a water moisture or steam (H$_2$O) may also be supplied between each pulse of the processing gas from operation 304 and the self-assembled monolayer precursor from operation 306 so as to trigger the deposition of the passivation layer 530 and the self-assembled monolayers 532. In the embodiment wherein the passivation layer 530 and the self-assembled monolayers 532 are formed in different processing chambers, the water moisture or steam (H$_2$O) may be obtained during the transfer of the substrate between different chambers to perform the passivation layer deposition process at operation 304 and the self-assembled monolayer (SAM) deposition process at operation 306 separately.

Figure 4D:
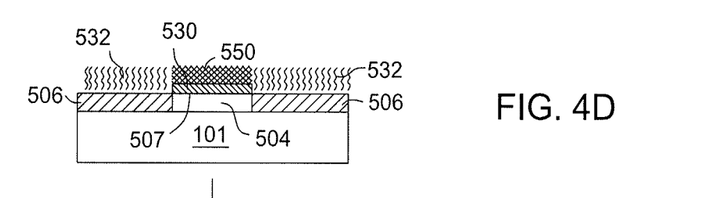

At operation 308, after the self-assembled monolayers 532 are formed, a selectively deposition process is then performed to form a material layer 550 on the passivation layer 530, as shown in FIG. 4D. The selective deposition process performed is performed to predominantly form the material layer 550 with compatible film qualities and characteristics to materials from the metal material 504, but not to the self-assembled monolayers 532 on the insulating material 506. As a result, the material layer 550 is selectively formed on the passivation layer 530, rather than on the self-assembled monolayers 532 or globally formed across the substrate 101, including the surfaces 505 of the insulating material 506 at other locations.

In the embodiments wherein the material layer 550 is selected to form on the passivation layer 530, the material layer 516 is a metal containing layer, such as a metal containing dielectric material. Suitable examples of the metal containing dielectric material for the material layer 550 include metal dielectric materials AlN, WSiO$_2$, WSi, AlON, TiN, TaN, TiON, TaON, hafnium containing oxide (HfO$_x$), zirconium oxide (ZrO$_x$), titanium oxide (TiO$_x$), tantalum oxide (TaO$_x$), niobium oxide (NbO$_x$), iron oxide (FeO$_x$), yttrium oxide (YO$_x$), aluminum oxide (AlO$_x$) and the like. In one particular example, the material layer is hafnium containing oxide (HfO$_x$) or Al$_2$O$_3$.

In one example, the selective deposition process may be an ALD process, CVD process, or any suitable deposition process. In one exampled depicted herein, the selective deposition process is an atomic layer deposition process utilizing the processing chamber 100 depicted in FIG. 1. Thus, the operations 304, 306, 308 may be integrated to perform in the same processing chamber without breaking vacuum. Alternatively, the operations 304, 306, 308 may be performed individually at different processing chambers as needed.

In the example wherein the selective deposition process is an ALD process, an atomic layer deposition (ALD) process is a chemical vapor deposition (CVD) process with self-terminating/limiting growth. The ALD process yields a thickness of only a few angstroms or in a monolayer level. The ALD process is controlled by distribution of a chemical reaction into two separate half reactions which are repeated in cycles. The thickness of the material layer 550 formed by the ALD process depends on the number of the reaction cycles.

The first reaction provides a first atomic layer of molecular layer being absorbed on the substrate and the second reaction provide a second atomic layer of molecular layer being absorbed on the first atomic layer. As the ALD process is very sensitive to the substrate conditions, the material layer 550 that forms on the passivation layer 530 may not be able to adhere or form on the self-assembled monolayers 532 due to the film material property difference. Thus, by utilizing the differences of the material properties at different locations from the substrate, a selective ALD deposition process may be enabled that allows the precursors from the ALD deposition process to nucleate and grow on the nucleate sites provided from the passivation layer 530, while inert to the surfaces from the self-assembled monolayers 532.

Though the examples depicted in FIG. 4A-4E shown that the material layer 550 and the passivation layer 530 is formed on the surface 507 of the metal material 504, it is noted that the materials of the material layer 550 and the passivation layer 530 may be selected to be formed on the surface 505 of the insulating material 506 or the self-assembled monolayers 532 as needed that allows the material layer 550 to be selectively formed on the metal material 504 as needed, or vice versa. Thus, the selective ALD deposition process grows the insulating material 506 on designated sites only without forming on the conductive material from the metal material 504 or vice versa.

During the ALD deposition process, a pulse of a first reactant gas mixture is supplied into the processing chamber, such as the processing chamber 100 depicted in FIG. 1, to form a first monolayer the material layer 550. It is believed that the first monolayer is absorbed onto the metal material 504 (or reversely on the insulating material 506) by a chemical reaction that allows the atoms from the first monolayer to be securely adhered on the atoms from the metal material 504. Since the metal containing molecules from the passivation layer 530 on the metal material 504 may have chemical properties different from the non-conductive material self-assembled monolayers 532 from the insulating material 506, the molecules from the self-assembled monolayers 532 may not be able to successfully adhere the atoms from the first monolayer of the material layer 550, thus only allowing the atoms from the first monolayer to be adhered on the atoms of the passivation layer 530 and/or the metal material 504. In this way, the subsequently formed second monolayer only selectively deposits on the first monolayer, thus enabling a selective deposition of an ALD process.

In the example wherein the material layer 550 is formed on the metal material 504, the material layer 550 is a hafnium containing oxide ($HfO_x$), zirconium oxide ($ZrO_x$), titanium oxide ($TiO_x$), tantalum oxide ($TaO_x$), niobium oxide ($NbO_x$), iron oxide ($FeO_x$), yttrium oxide ($YO_x$), aluminum oxide ($AlO_x$), and the like. In another example wherein the material layer 550 is metal containing materials, suitable example thereof include Ni, Ru, TaN, TiN, Pt, Ir, Cu, Co, Al, W, alloys thereof or any suitable materials as needed.

Figure 4E:
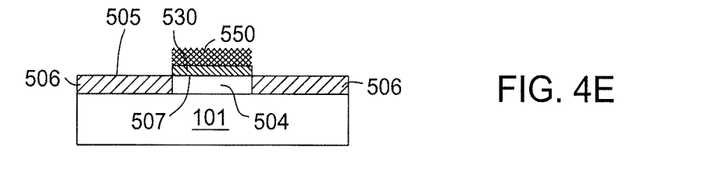

At operation 310, after the material layer 550 is formed, a removal process is then performed. The removal process selectively removes the self-assembled monolayers 532 remained on the top surface 505 of the insulating material 506, as shown in FIG. 4E. The removal process may be a wet process utilizing liquid solution or a dry process utilizing plasma.

In one example, the removal process is a wet process performed by immersing, or soaking the substrate 101 with or in a self-assembled monolayer removal solution. In another example, a dry process, such as a vapor or a plasma process, is utilized to react with the self-assembled monolayers 532 without undergoing the thermal treatment process. The wet process performed by dipping, immersing, or soaking the substrate with or in the self-assembled monolayer solution in a wet tank. self-assembled monolayer removal solution may be an alcohol, alkaline, neutral or acid solution with a pH value in a predetermined range. Selection of the self-assembled monolayer removal solution is based on the material types of the self-assembled monolayers 532 remained on the substrate 101. In another specific example, the removal process may be a dry process, such as etching, ashing or striping, performed by positioning the substrate in a processing chamber and treating the surface of the substrate using a plasma. The plasma is formed by a removal gas mixture. In one example, the removal gas mixture includes at least one halogen containing gas, a hydrogen containing gas, an oxygen containing gas or the like. Suitable examples of the halogen containing gas include $H_2$, $O_2$, HBr, $CF_4$, $CHF_3$, HCl, $Cl_2$, $CH_2F_2$, $C_2F_6$, $C_2F_8$, $C_4F_6$, $SF_6$, $NF_3$, $CO_2$, CO and the like.

Thus, a selective deposition process is provided to form certain materials on certain surfaces, e.g., different portions of a structure formed on a substrate by utilizing a passivation structure and self assembled monolayers. The method utilizes a passivation layer to enable a selective ALD process or a selective self assembled monolayer deposition process to form a material layer on certain locations of a structure of a substrate. Thus, a structure with desired different type of materials formed on different locations in the structure may be obtained.

While the foregoing is directed to embodiments of the present disclosure, other and further embodiments of the disclosure may be devised without departing from the basic scope thereof, and the scope thereof is determined by the claims that follow.

What is claimed is:

1. A method of forming a structure with desired materials on a substrate comprising:
   supplying a first gas comprising a hydroxy terminated hydrocarbon containing material to a surface of a substrate;
   selectively forming a passivation layer on a first material of the substrate;
   selectively forming self assembled monolayers on a second material of the substrate; and
   selectively forming a material layer on the passivation layer.

2. The method of claim 1, wherein the hydroxy terminated hydrocarbon containing material has a formula of $(C_xH_y)(OH)_z$, which x, y and z are integers.

3. The method of claim 2, wherein the hydroxy terminated hydrocarbon containing material is methanol ($CH_3OH$) or ethanol ($C_2H_5OH$).

4. The method of claim 1, wherein the first material is a metal material.

5. The method of claim 4, wherein the passivation layer comprises a metal material having hydro-group (—H) or —$OCH_3$ group attached thereto.

6. The method of claim 1, wherein the passivation layer has a thickness between about 2 Å and about 30 Å.

7. The method of claim 1, wherein the material layer is a metal containing layer or a metal containing dielectric layer.

8. The method of claim 7, wherein the material layer is at least one of AlN, $WSiO_2$, WSi, AlON, TiN, TaN, TiON, TaON, hafnium containing oxide, zirconium oxide, titanium oxide, tantalum oxide, niobium oxide, iron oxide, yttrium oxide, and aluminum oxide.

9. The method of claim 8, wherein the material layer is at least one of hafnium containing oxide or aluminum oxide.

10. The method of claim 1, wherein the second material is an insulating material.

11. The method of claim 1, wherein selectively forming the material layer is by an atomic layer deposition process.

12. The method of claim 1, further comprising:
supplying a pulse of water steam onto the substrate prior to forming the self assembled monolayers.

13. The method of claim 1, wherein supplying the first gas comprising the hydroxy terminated hydrocarbon containing material further comprises:
supplying a pulse comprising water steam to the substrate surface.

14. The method of claim 1, wherein the passivation layer, the self assembled monolayers and the material layer are formed in a single processing chamber.

15. The method of claim 1, further comprising:
maintaining a substrate temperature between 100 degrees Celsius and about 300 degrees Celsius.

16. A method of forming a structure with desired materials on a substrate for semiconductor applications comprising:
selectively forming a passivation layer on a first material of a substrate, wherein the passivation layer comprises a metal material having hydro-group (—H) or —OCH$_3$ group attached thereto;
selectively forming self assembled monolayers on a second material of the substrate; and
selectively forming a material layer on the passivation layer using an atomic layer deposition process.

17. The method of claim 16, wherein the passivation layer is formed by supplying a processing gas comprising hydroxy terminated hydrocarbon containing material to a surface of the substrate.

18. The method of claim 17, wherein the hydroxy terminated hydrocarbon containing material has a formula of $(C_xH_y)(OH)_z$, which x, y and z are integers.

19. The method of claim 18, wherein the hydroxy terminated hydrocarbon containing material is methanol ($CH_3OH$) or ethanol ($C_2H_5OH$).

20. A structure comprising:
a passivation layer comprising a metal material having hydro-group (—H) or —OCH$_3$ group attached thereto formed on a first material of a substrate, wherein the substrate includes a second material formed among the first material, wherein the first material is a metal material and the second material is an insulating material; and
a material layer formed on the passivation layer, wherein the material layer is a metal containing dielectric layer.

* * * * *